United States Patent [19]
Saika et al.

[11] Patent Number: 5,324,928
[45] Date of Patent: Jun. 28, 1994

[54] METHOD OF DRIVING A THIN FILM TRANSISTOR TYPE OPTICAL SENSOR AND THE DRIVE UNIT

[75] Inventors: Toshihiro Saika, Zama; Isao Kobayashi, Sagamihara; Noriyuki Kaifu, Yokohama; Tadao Endo, Atsugi, all of Japan

[73] Assignee: Canon Kabushiki Kaisha, Tokyo, Japan

[21] Appl. No.: 980,975

[22] Filed: Nov. 24, 1992

Related U.S. Application Data

[62] Division of Ser. No. 675,336, Mar. 26, 1991, Pat. No. 5,184,007.

[30] Foreign Application Priority Data

Mar. 27, 1990 [JP] Japan ................................ 2-78405

[51] Int. Cl.$^5$ ............................................. H01J 40/14
[52] U.S. Cl. ................................. 250/208.1; 257/448
[58] Field of Search ............ 250/208.1, 214 R, 214.1; 257/443, 448

[56] References Cited
U.S. PATENT DOCUMENTS

| | | |
|---|---|---|
| 4,886,977 | 12/1989 | Gofuku et al. |
| 4,945,418 | 7/1990 | Mutoh . |
| 4,980,546 | 12/1990 | Berger . |
| 5,057,889 | 10/1991 | Yamada et al. |
| 5,184,007 | 2/1993 | Sakai et al. ........................ 250/208.1 |

FOREIGN PATENT DOCUMENTS

| | | | |
|---|---|---|---|
| 57-72370 | 5/1982 | Japan . | |
| 63-092153 | 4/1988 | Japan ........................... | H04N 1/028 |
| 2191908A | 12/1987 | United Kingdom .......... | H04N 3/15 |

OTHER PUBLICATIONS

*The Japan Society Of Applied Physics*, Extended Abstracts of the 19th Conference on Solid State Devices and Materials, Aug. 27, 1987, pp. 509–510, Saika, T., et al.: "Integrated a-Si:H Linear Image Sensor Using TFT Type Photo-Sensor."

*Primary Examiner*—David C. Nelms
*Assistant Examiner*—K. Shami
*Attorney, Agent, or Firm*—Fitzpatrick, Cella, Harper & Scinto

[57] ABSTRACT

The present invention relates to a method of driving a thin film transistor type optical sensor, having a gate electrode, a gate insulating layer, a thin film semiconductor layer, an ohmic contact layer, a source electrode and a drain electrode.

The thin film transistor type optical sensor is driven by providing the gate electrode with a threshold voltage for a thin film transistor provided adjacent to the thin film transistor type optical sensor or a voltage based on the threshold voltage.

19 Claims, 9 Drawing Sheets

METHOD OF DRIVING A THIN FILM TRANSISTOR TYPE OPTICAL SENSOR AND THE DRIVE UNIT

This application is a division of application Ser. No. 07/675,336 filed Mar. 26, 1991, now U.S. Pat. No. 5,184,007.

BACKGROUND OF THE INVENTION

1. Field of the Invention

The present invention relates to an optical sensor used for an image reader of an image processing device such as a facsimile apparatus or a digital copying machine and, more particularly both to a method of driving a thin film transistor (hereinafter called "TFT") type optical sensor which is so constructed that a gate electrode is provided through an insulating layer for a thin film semiconductor layer, to the drive unit.

2. Related Background Art

As a construction example of the TFT type optical sensor, FIG. 1 shows a typical plan view, and FIG. 2 shows a sectional view along line 2-2' in FIG. 1. In FIGS. 1 and 2, numeral 1 denotes a substrate of glass, etc., numeral 2 denotes a gate electrode, numeral 3 denotes a gate insulating layer, numeral 4 denotes a photo conductive semiconductor thin film, and numeral 5 denotes an ohmic contact layer used to make an ohmic contact between the semiconductor thin film 4 and both a source electrode 6 and a drain electrode 7.

When such a TFT type optical sensor is normally used in a charge accumulation mode as an image reader, a bias voltage VB is applied to the gate electrode as shown in FIG. 3 for stable operation. In FIG. 3, a sensor battery VS is connected to a drain electrode, and an accumulation capacitor C is connected to a source electrode. A charge stored in the accumulation capacitor C is discharged to a load resistance RL by a transfer switch SW.

Even in this TFT type optical sensor, the electrical quality may change when the interface or the surface condition of the thin film semiconductor layer is affected by the film forming process or an etching process in the production process. Also when it is produced on a large area of substrate, etc., the distribution in these processes may cause great distribution to the electrical quality.

To give such an example, when a TFT type optical sensor has been formed at intervals of about 20 mm on a large area (320×256 mm) of glass substrate a shown in FIG. 4, a light current Ip and dark current Id (when a voltage between gate voltage and source voltage Vgs=0 V) of a TFT type optical sensor on the A-A' line in FIG. 4 are distributed as shown in FIG. 5, for example, and the S/N may also decrease depending upon the location.

Even in a driving method in which a bias voltage is applied to the gate electrode for stable operation, there may be problems at issue in the S/N decreases and a distribution occurs in the sensor output value.

For this reason, a method to adjust the gate bias voltage is used in accordance with such an array position of a TFT type optical sensor as shown in the Japanese Patent Appln. Laid-Open No. 63-92153 previously filed by the present applicants. The equivalent circuit of this is shown in FIG. 6.

In FIG. 6, Sl,1 to Sm,n are TFT type optical sensors, CSl,1 to CSm,n are accumulation capacitors, Ul,1 to Um,n are transfer TFTS, and Vl,1 to Vm,n are reset TFTS.

The above-mentioned element group is divided into m blocks n by pieces, and is matrix connected to (m+1) pieces of gate lines and n pieces of signal lines.

A driver unit 11 applies a voltage to gate lines VG1 to VGm+1 in order, a signal processing unit 12 takes out a signal voltage from signal lines Sl to Sn, and a control unit 13 applies a control voltage to sensor gate lines VB1 to VBm. Also VS is a sensor bias voltage, VR is a reset voltage for the accumulation capacitor, and CL1 to CLm are load capacitors.

Although the above-mentioned problems at issue can be almost solved by this system, new problems at issue such as adding out-going wiring for the gate bias and requiring an adjustable external power supply occur, preventing the cost of the image reader from being reduced. Further since the gate bias voltage value should be adjusted each time, it increases the production man-hour, hindering any the cost reduction.

SUMMARY OF THE INVENTION

Thus, it is an object of the present invention to reduce the costs of an image reader and equipment to which it is applied, by adopting a driving method which does not require adjusting the gate bias voltage externally, but allows the TFT type optical sensor to output a good S/N ratio and without causing any distribution.

In a method of driving a thin film transistor type optical sensor having a gate electrode, a gate insulating layer, a thin film semiconductor layer, an ohmic contact layer, a source electrode and a drain electrode, it is a further object of the present invention to propose a method of driving a thin film transistor type optical sensor which drives the thin film transistor type optical sensor by providing the gate electrode with a threshold voltage for a thin film transistor provided adjacent to the thin film transistor type optical sensor or a voltage based on the threshold voltage.

In a method of driving a thin film transistor type optical sensor having a gate electrode, a gate insulating layer, a thin film semiconductor layer, an ohmic contact layer, a source electrode and a drain electrode, it is another object of the present invention to provide a method driving a thin film transistor type optical sensor which is driven by setting the potential at the gate electrode of the thin film transistor type optical sensor to a threshold potential or a potential having a desired specified potential difference based on the threshold potential.

In a drive unit for a thin film transistor type optical sensor having a gate electrode, a gate insulating layer, a thin film semiconductor layer, an ohmic contact layer, a source electrode and a drain electrode, it is another object of the present invention to provide a drive unit for a thin film transistor type optical sensor, wherein the potential at the gate electrode is set to a threshold potential or a potential having a desired fixed potential difference based on the threshold potential using a thin film transistor in which a gate electrode provided near the thin film transistor type optical sensor is connected to a drain electrode.

It is another object of the present invention to provide an image processing device, comprising:

a thin film transistor type optical sensor having a gate electrode, a gate insulating layer, a thin film semiconductor layer, an ohmic contact layer, a source electrode and a drain electrode; and a thin film transistor which has been provided near the thin film transistor type optical sensor, wherein;

a drain electrode and a gate electrode of the thin film transistor are electrically connected to a gate electrode of the thin film transistor type optical sensor, and a battery is equipped to apply a desired voltage to the source electrode of the thin film transistor type optical sensor.

DESCRIPTION OF THE PREFERRED EMBODIMENTS

Figure 1:
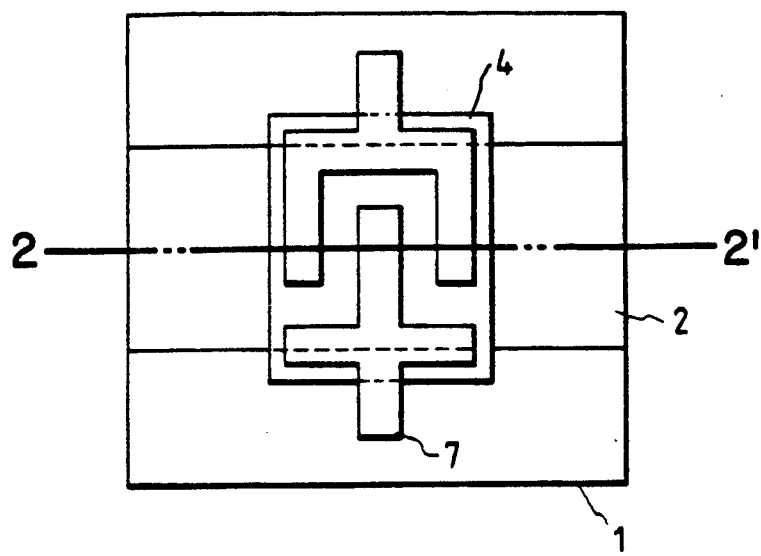
FIG. 1 is a typical plan view showing a construction example of a conventional TFT type optical sensor.
Figure 2:
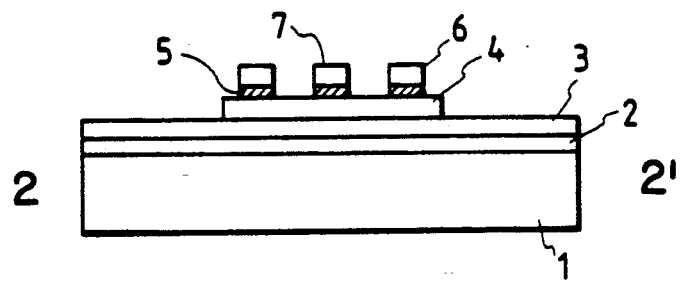
FIG. 2 is a section view on 2-2' in FIG. 1.
Figure 3:
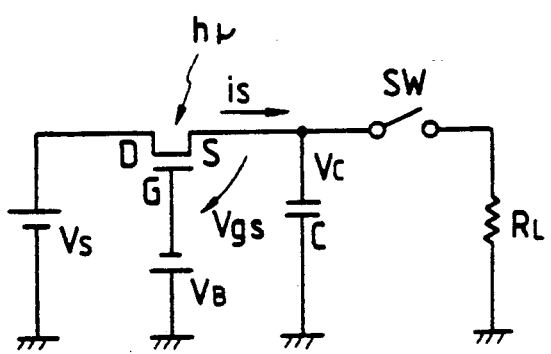
FIG. 3 shows a driving circuit for a conventional TFT type optical sensor.

In a thin film transistor type optical sensor comprising a gate electrode, a gate insulating layer, a thin film semiconductor layer, an ohmic contact layer, a source electrode and a drain electrode, the above-mentioned objects can be accomplished by setting the potential at the gate electrode of the thin film transistor type optical sensor to a threshold potential or a potential having a desired fixed potential difference based on the threshold potential.

This enables smoothing the sensor output distribution to be smoothed without requiring any external adjustment, and also reduces the dark current, improves the S/N, and a low-priced, high performance image reader can be constructed.

First Embodiment

The present invention will be described in detail referring to the drawings below.

Figure 4:
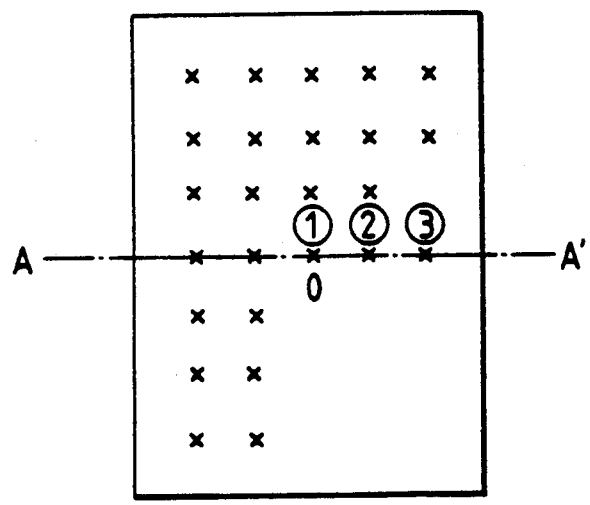
FIG. 4 is a typical plan view showing a device obtained by forming the TFT type optical sensor on a large area on a glass substrate.
Figure 5:
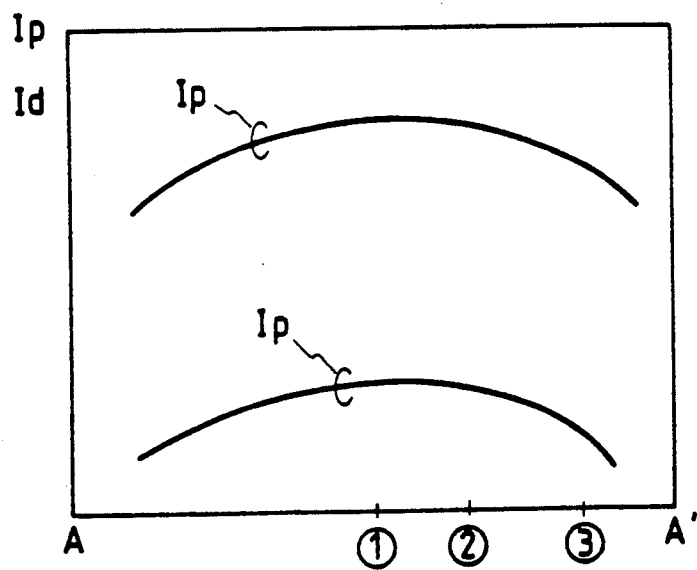
FIG. 5 shows the relationship between light current Ip and dark current Id of the TFT type optical sensor on the A-A' line of a device in FIG. 4.
Figure 6:
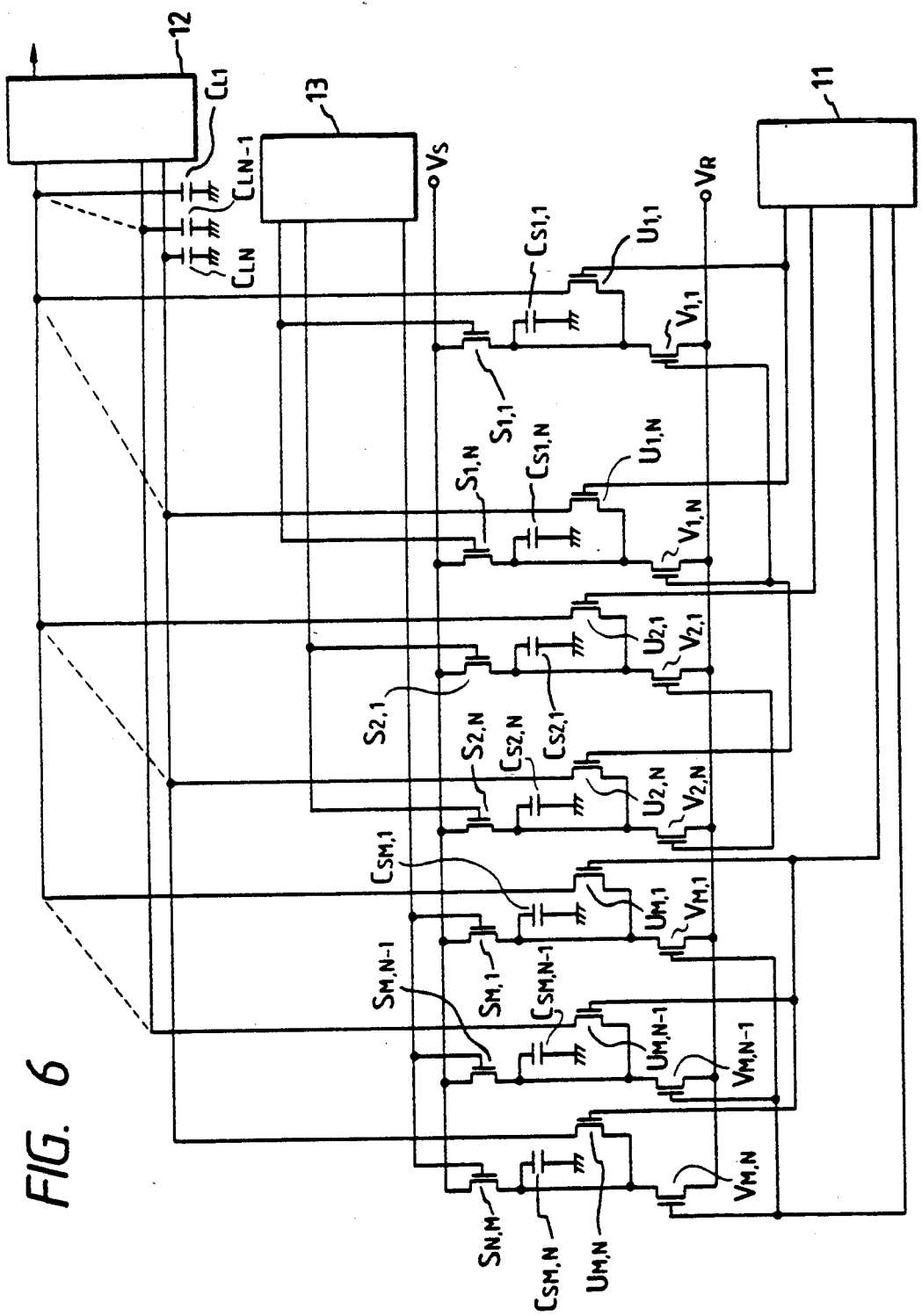
FIG. 6 shows an equivalent circuit for a conventional example of a TFT type sensor.

First, the following is an explanation of the cause of the distribution of the light current Ip and dark current Id values in the TFT type optical sensor in a large area of glass substrate shown in FIG. 4 as shown in FIG. 5. When a relationship between the gate voltage Vgs and light current Ip and a relationship between the gate voltage Vgs and dark current Id have been investigated in the TFT type optical sensor on the points ①, ② and ③ (which correspond to the positions of ①, ② and ③ in FIG. 5 respectively) on the line A-A' in FIG. 4, characteristics such as shown in FIGS. 7 and 8 have been obtained.

Figure 7:
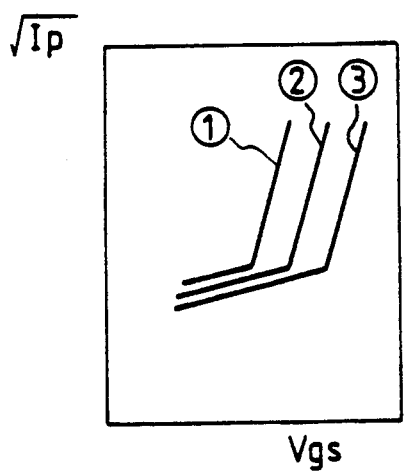
FIG. 7 shows the relationship between gate voltage Vgs and light current Ip of the TFT type optical sensor on the A-A' line in FIG. 17.
Figure 8:
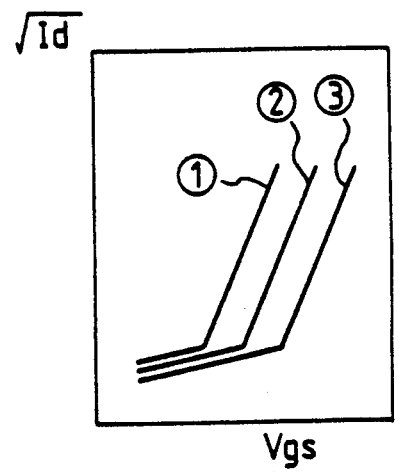
FIG. 8 shows the relationship between gate voltage Vgs and dark current Id of the TFT type optical sensor on the A-A' line in FIG. 17.

When the gate voltage is less than a certain value as shown in FIGS. 7 and 8, both light current and dark current show a small value because of an OFF condition in which no TFT channel is formed. When the gate voltage exceeds a certain value, a channel is formed and the TFT is on, and then a normal TFT switching characteristic, in which a large current flows, has been obtained. A gate voltage, at which the state changes from OFF to ON, is called the "threshold potential" hereafter.

The relationship between the positions ①, ② and ③ of this TFT type optical sensor and the threshold potential becomes ①<②<③ for both light current and dark current. However, an inclination in the current-voltage characteristic in OFF state and that in ON state are almost the same irrespective of the positions of ①, ② and ③.

That is, the relationship between the gate voltage Vgs of the TFT type optical sensor at the positions ①, ② and ③ and the current Ip, Id has been shown to vary in such a way that only the respective threshold potentials have shifted.

Figure 9:
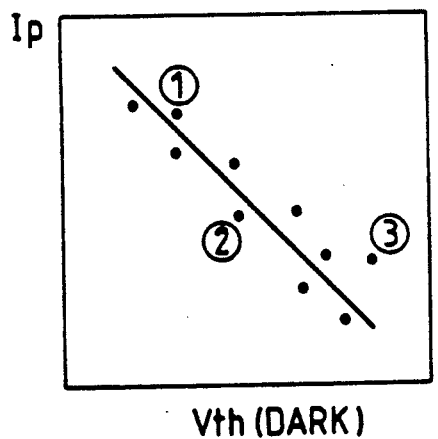
FIG. 9 shows the relationship between threshold potential Vth of dark current and light current Ip.
Figure 10:
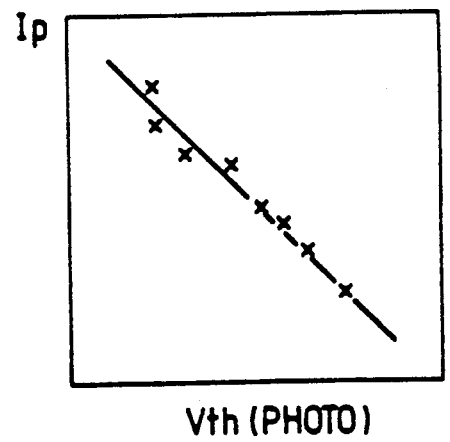
FIG. 10 shows the relationship between threshold potential Vth of light current and light current Ip.

As a result of categorizing these results, it has become evident that there is a correlation between the threshold potential of dark current, light current and light current Ip as shown in FIGS. 9 and 10.

From the foregoing, it is believed that the characteristic distribution as shown in FIG. 5 occurs because the actual operating points differ respectively because the threshold potential operates the shifted TFT type optical sensor under a Vgs=constant condition.

It has been found from numerous experiments that it is possible to provide uniform distribution characteristics by driving the sensor to correct the shift at this threshold potential.

This correction method will be described.

Figure 11:
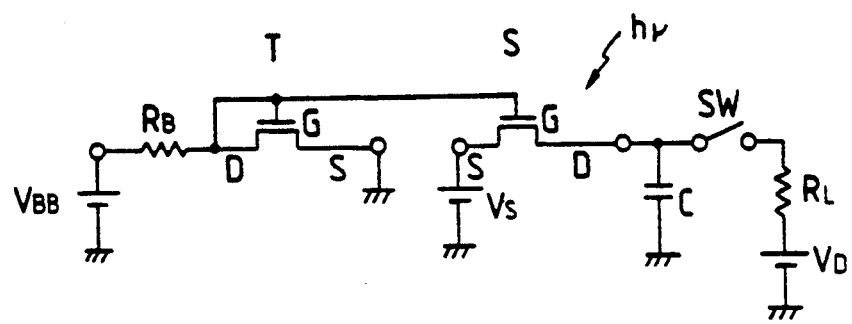
FIG. 11 shows a read-out circuit in an accumulation mode using a method of driving a TFT type optical sensor of a preferred embodiment according to the present invention.

FIG. 11 shows an example of a read-out circuit in an accumulation mode using a method of driving a TFT type optical sensor according to the present invention. This circuit consist of a TFT type optical sensor and a portion which supplies a gate bias voltage. A source bias battery VS is connected to the source electrode of the TFT type optical sensor S, and an accumulation capacitor C is connected to the drain electrode.

The accumulation capacitor C is connected to a load resistance RL and sensor battery VD through a transfer switch SW. The accumulation capacitor is further connected to the gate electrode of TFT T for supplying a gate bias voltage. Values of the sensor battery VD and source bias battery VS are so set that VD>VS.

In a gate bias voltage supply unit, one end of a bias resistance RB is connected to a bias battery VBB, and the other end is connected to the drain electrode of the bias TFT T. Further the drain electrode of the TFT T is also connected to the gate electrode, and the source electrode is grounded.

Figure 14:
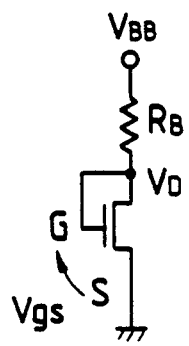
FIG. 14 is a circuit diagram for a gate bias voltage supply unit in which the gate electrode of TFT is connected to the drain electrode.
Figure 15:
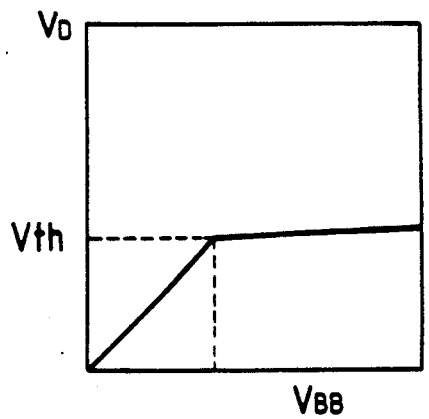
FIG. 15 shows the relationship between the bias voltage VBB and the voltage Vd of drain electrode in the circuit in FIG. 14, and threshold potential Vth.

The operation of the gate bias voltage supply unit for this circuit is shown in FIGS. 14 and 15. In a state (so-called diode connection), in which the TFT gate electrode is connected to the drain electrode as shown in FIG. 14, by properly setting the bias resistance RB value, the voltage VD of the drain electrode changes to almost an inclination of 1 with respect to the bias voltage VBB up to the TFT threshold potential Vth as shown in FIG. 15, and thereafter the VD value remains at approximately t Vth value irrespective of the VBB value because TFT shifts to ON state.

That is, the TFT drain electrode is placed at a potential almost equivalent to Vth by setting the bias resistance RB value properly and by setting the bias battery VBB value to a value higher than the TFT threshold potential Vth value in the circuit in FIG. 14.

By setting a potential in the above-mentioned gate bias voltage supply unit to the TFT type optical sensor gate potential as shown in FIG. 11, the voltage Vgs between the gate and source of the TFT type optical sensor will be set to Vgs=Vth−VS.

Although this threshold potential Vth is Vth of the bias TFT, the threshold potential can be expected to be almost equal to the threshold potential of the TFT type optical sensor because it is easy to allocate the threshold potential very near the TFT type optical sensor. That is, the operating point of the voltage Vgs between gate and source of the TFT type optical sensor is to be always set at a point only VS lower than its own Vth.

By this driving method, the shift of the threshold potential Vth is corrected in the relationship between gate voltage Vgs and light current Ip as shown in FIGS. 7 and 8, and in the relationship between gate voltage Vgs and dark current Id. As a result, the distribution of light current Ip and dark current Id has been improved as compared with the distribution in the case of an ordinary driving method as shown in FIG. 5.

Figure 12:
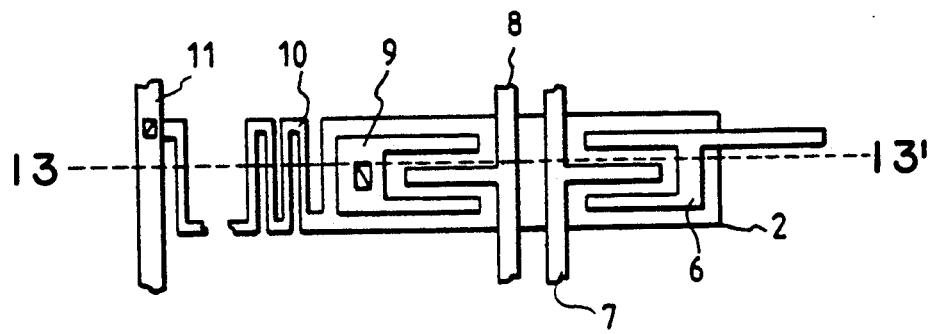
FIG. 12 is a typical plan view showing a construction example of a preferred circuit according to the present invention shown in FIG. 11.
Figure 13:
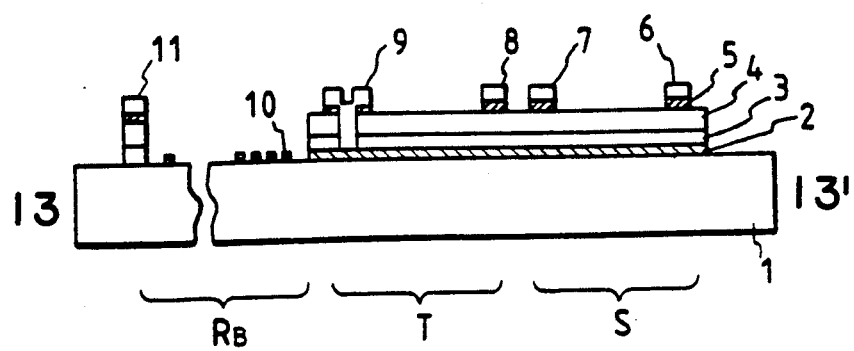
FIG. 13 is a section view on 13-13' in FIG. 12.

As a construction example of a circuit according to the present invention shown in FIG. 11, FIG. 12 shows a typical plan view, and FIG. 13 shows a typical section view on 13-13' in FIG. 12. In FIGS. 12 and 13, S is a TFT type optical sensor, T is a bias TFT, and RB is a bias resistance. Numeral 1 is a substrate of glass, etc., numerals 2, 3, 4, 5, 6, and 7 are a gate electrode, a gate insulating layer, a photo conductive semiconductor thin film, an ohmic contact layer, a drain electrode, and a source electrode of the TFT type optical sensor respectively, and numerals 8 and 9 are a bias TFT source, and a drain electrode respectively.

Numeral 10 is a bias resistance, and 11 is a bias battery wiring. In this embodiment according to the present invention, the circuit is composed of the gate electrode for the TFT type optical sensor, the gate electrode for the bias TFT, and a conductive layer with the same bias resistance.

Figure 16:
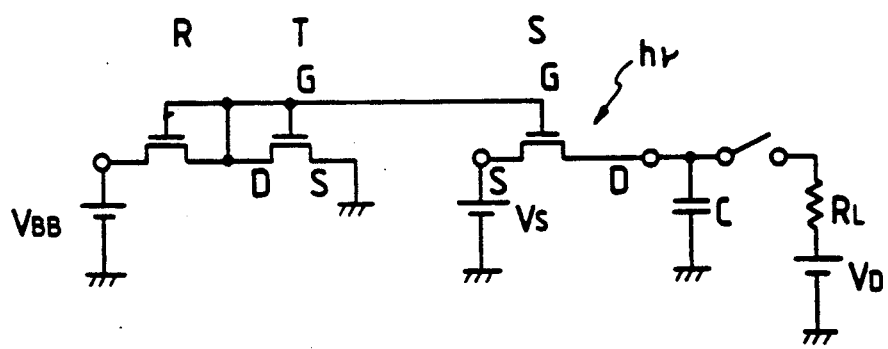
FIG. 16 is a equivalent circuit diagram in an embodiment using TFT R in which the gate electrode is connected to the source electrode instead of the bias resistance RB in the circuit in FIG. 11 according to the present invention.

FIG. 16 shows an equivalent circuit in an embodiment using a TFT R in which the gate electrode is connected to the source electrode instead of the bias resistance RB in FIG. 11. The TFT R is always left off as an enhancement type TFT in which the threshold potential is positive. When this resistance R OFF in the OFF state is set to a requested bias resistance RB value by appropriately designing the channel width and channel length of the TFT R, the same operation as the gate bias voltage supply unit in FIG. 1 can be performed.

Second Embodiment

Figure 17:
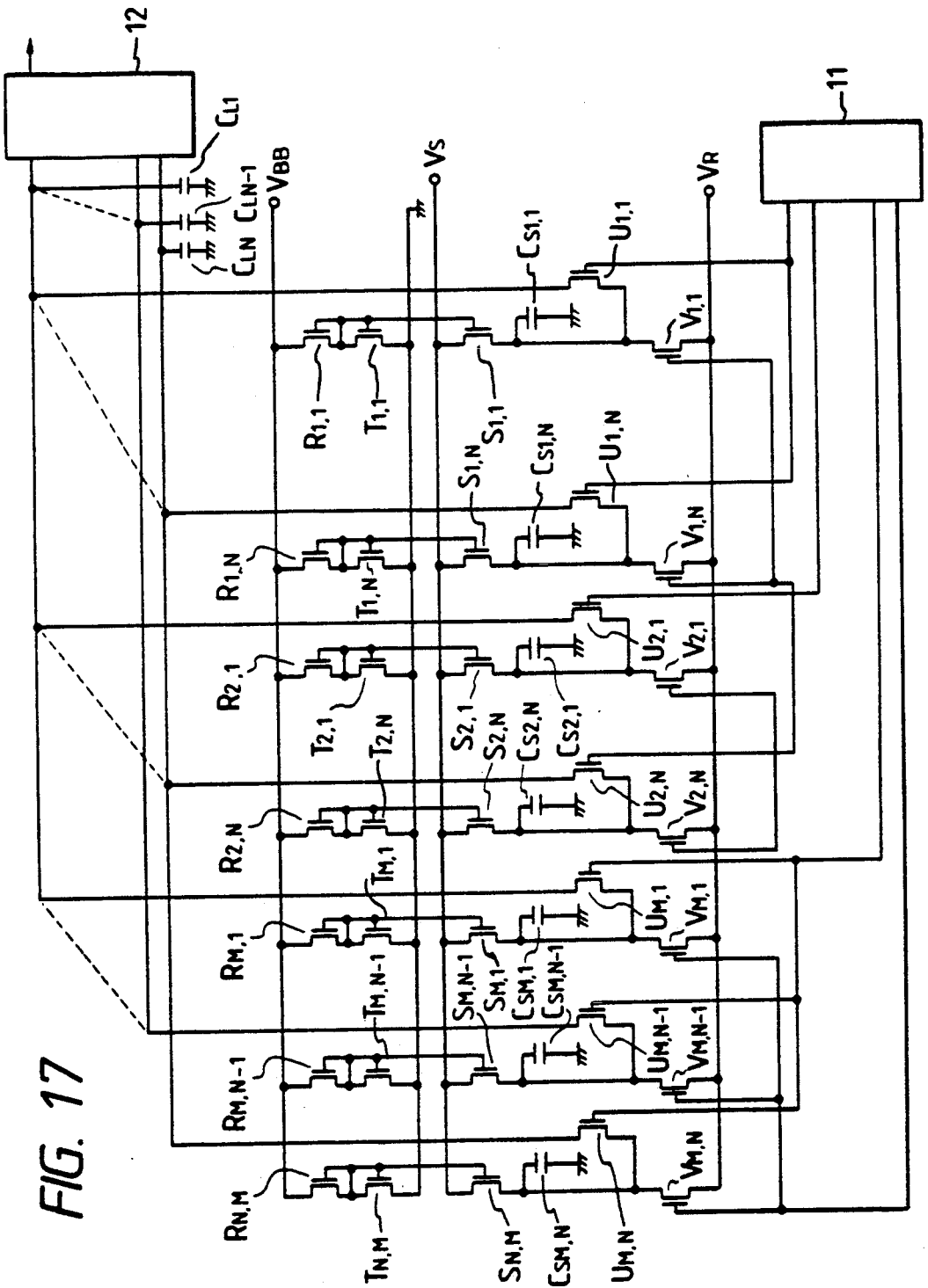
FIG. 17 is an equivalent circuit diagram of a line sensor type image reader which has been so constructed that the driving circuit shown in FIG. 16 is allocated in a n-by-m array.

FIG. 17 shows an equivalent circuit of a line sensor type image reader which has been so constructed that a driving circuit shown in FIG. 16 is allocated in a n-by-m array.

In FIG. 17, Sl,1 to Sm,n are TFT type optical sensors, CS1,1 to CSm,n are accumulation capacitors, U1,1 to Um,n are transfer TFTS and V1,1 to Vm,n are reset TFTS. The above-mentioned element group is divided into m blocks n pieces by pieces, and is matrix connected to (m+1) pieces of gate lines and n pieces of signal lines.

T1,1 to Tm,n are bias TFTS, and R1,1 to Rm,n are bias loading TFTS.

A driver unit 11 applies a voltage to gate lines VG1 to VGm+1 in order, and a signal processing unit 12 takes out a signal voltage from signal lines S1 to Sn. Also VS is a sensor bias voltage, VR is a reset voltage for the storage capacitor, VBB is a bias voltage, and CL1 to CLm are readout capacitors.

In this circuit, the gate electrode of the reset TFT U is connected to the gate electrode of the transfer TFT T for the next block in common. By shifting the voltage pulse of the driver unit 11, the previous block can be reset the moment a signal of the next block is transferred.

The above-mentioned circuit can be all constructed on the same substrate. Especially by using a—Si:H film as the photo conductive semiconductor material, the construction order can be performed in a simultaneous process by means of the following lamination construction: a TFT type optical sensor, an accumulation capacitor, a transfer TFT, a reset TFT, a bias TFT, a loading TFT, wiring, etc. for the lower electrode, and a SiNH insulating layer, a—Si:H layer and an n layer for the upper electrode. A pattern example of an image reader using this type of process will be described.

Figure 18:
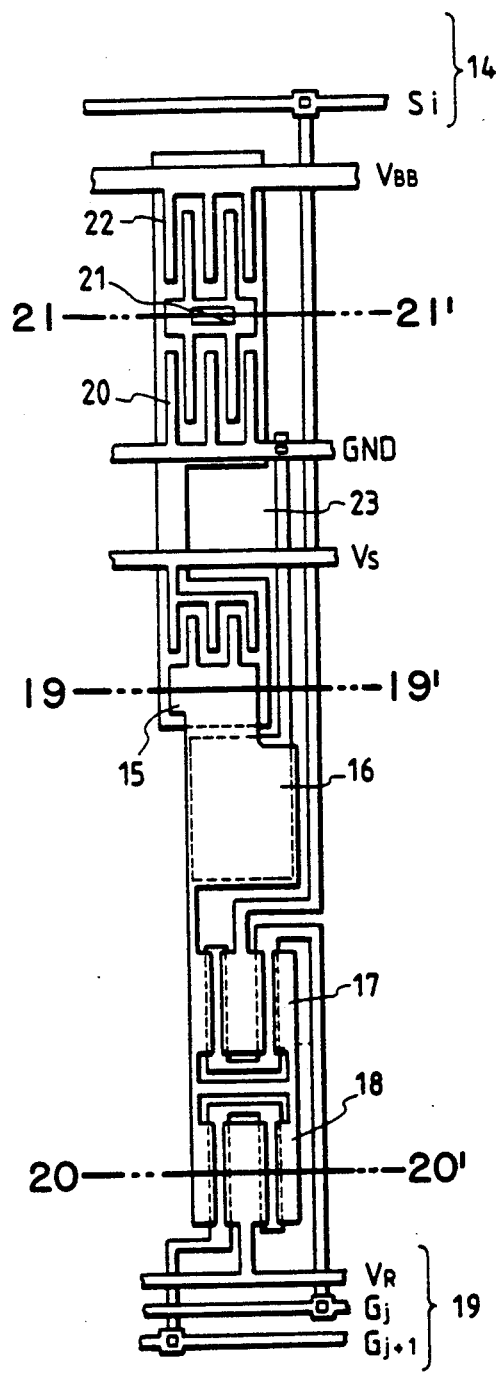
FIG. 18 is a typical construction pattern diagram for one bit of the circuit in FIG. 17.

FIG. 18 shows a construction pattern diagram for one bit of the circuit in FIG. 17. However, only the upper and lower electrode patterns and contact holes are shown to avoid the complexity of the figure.

In FIG. 18, numeral 14 is a signal line matrix, numeral 15 is a TFT type optical sensor, numeral 16 is an accumulation capacitor, numeral 17 is a transfer TFT, numeral 18 is a reset TFT, numeral 19 is a wiring area for gate driving lines, numeral 20 is a bias TFT, numeral 21 is a contact hole for connecting a gate and a drain, and numeral 22 is a bias loading TFT.

Figure 22:
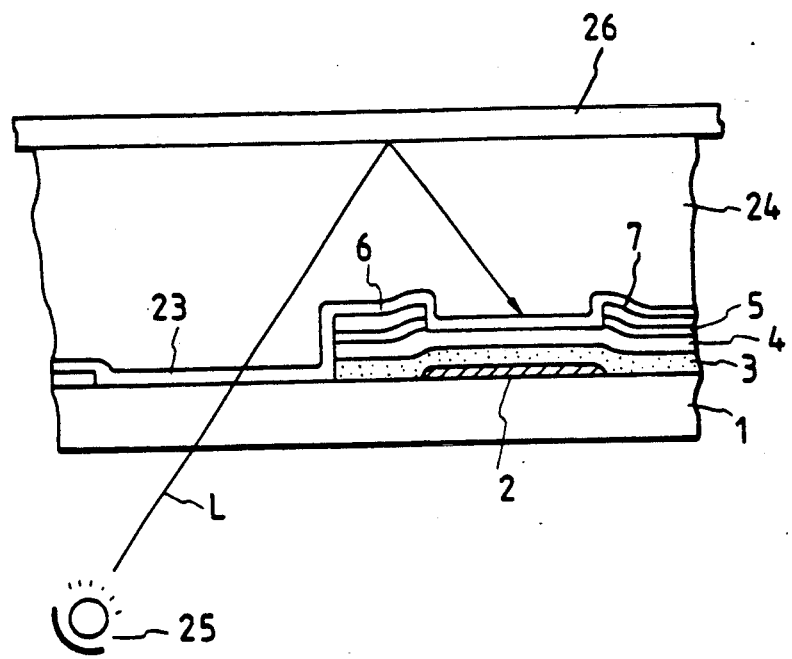
FIG. 22 is a typical section view showing an example of a complete lensless contact sensor.
Figure 23:
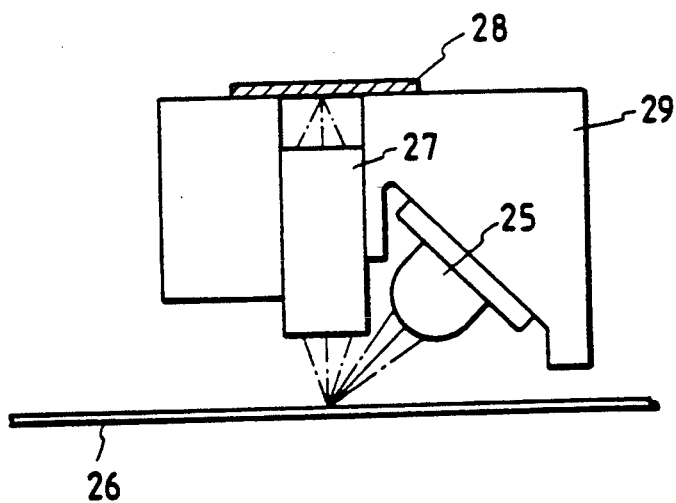
FIG. 23 is a typical section view showing an example of a complete contact sensor with a lens.

As shown in FIG. 22 in this example, an abrasion resistant layer 24 is formed above the TFT type optical sensor, and a window 23 is provided to light a draft 26 by a light source 25 through the rear surface of the sensor, and further the gate electrode of the TFT type optical sensor is made of an opaque material in order to enable complete close-contact reading without a lens. This can be also used for a close-contact read type image reader using such an equal magnification image-formation lens 27 such as shown in FIG. 23.

Although read-out capacitors CL to CLn are not shown in FIG. 8, their capacitance is set to 10 to several hundreds times the stray capacitance between signal lines which occur in a signal line matrix 14. The image may be, of course, read out in the form of a direct current using a load resistance as shown in the above-mentioned embodiment without using the stray capacitance.

Figure 19:
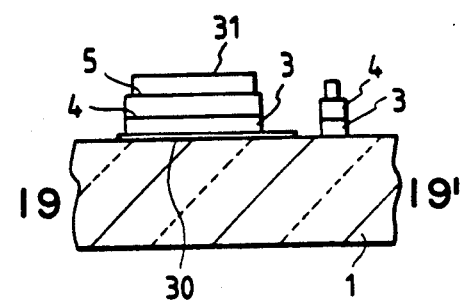
FIG. 19 is a section view on 19-19' in FIG. 18.
Figure 20:
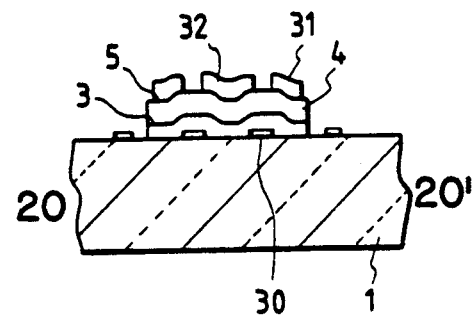
FIG. 20 is a section view on 20-20' in FIG. 18.
Figure 21:
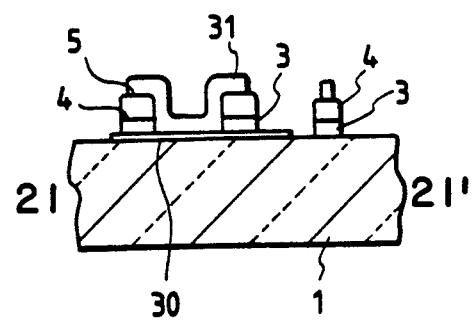
FIG. 21 is a section view on 21-21' in FIG. 18.

FIG. 19 shows a section view on 19-19' in FIG. 18.
FIG. 20 shows a section view on 20-20' in FIG. 18.
FIG. 21 shows a section view on 21-21' in FIG. 18.

In FIGS. 19, 20 and 21, numeral 1 is a substrate of glass, etc., and numeral 30 is a lower electrode, which is a gate electrode of the TFT type optical sensor in FIG. 19, a gate electrode of TFT in FIG. 20, and a gate electrode of bias TFT in FIG. 21.

In the above-mentioned example, a bias TFT is allocated for each bit of the TFT type optical sensor to correct the shift of the threshold potential of each bit of the TFT type optical sensor. When, however, the distribution of the shift amount of this threshold voltage is lower than the array of the TFT type optical sensor, it is, of course, possible to correct the shift in units of blocks of bits by dividing the TFT type optical sensor into blocks and allocating a bias TFT for each block.

Since it is possible to correct the lowered S/N of the TFT type optical sensor and the sensor output distribution without requiring any external adjustment according to the present invention as described above, a low-priced, high performance image reader can be constructed.

We claim:

1. A photosensor device comprising a thin-film transistor type photosensor and a thin-film transistor formed on a common substrate, said thin-film transistor type photosensor and said thin film transistor each including a gate electrode, a gate insulating layer, a thin-film semiconductor layer, an ohmic contact layer, a source electrode and a drain electrode, wherein
said thin-film transistor type photosensor is arranged adjacent to said thin-film transistor, wherein
at least the respective gate insulating layer and thin-film semiconductor layer, of said thin-film transistor type photosensor and said thin-film transistor, are commonly formed as continuous layers, and wherein
the gate electrode of said thin-film transistor type photosensor and the gate and drain electrodes of said thin-film transistor are electrically connected to each other.

2. A photosensor according to claim 1, wherein the gate electrode of said thin-film transistor type photosensor and the gate electrode of said thin-film transistor are formed as a continuous common layer.

3. A photosensor according to claim 1, wherein said thin-film semiconductor layer comprises amorphous silicon.

4. A photosensor according to claim 3, wherein the thin-film semiconductor layer further includes hydrogen.

5. A photosensor according to claim 1, wherein the ohmic contact layers are n-type.

6. A photosensor according to claim 1, wherein the gate insulating layer includes silicon and nitrogen.

7. A photosensor according to claim 6, wherein the gate insulating layer further includes hydrogen.

8. An image processing apparatus comprising:
a photosensor including a thin-film transistor type photosensor and a thin-film transistor formed on a common substrate, said thin-film transistor type photosensor and said thin-film transistor each comprising a gate electrode, a gate insulating layer, a thin-film semiconductor layer, an ohmic contact layer, a source electrode and a drain electrode; and
a power source for supplying a voltage to the gate electrode of said thin-film transistor type photosensor, and to the gate and drain electrodes of said thin-film transistor, wherein
said thin-film transistor type photosensor and said thin-film transistor are arranged adjacent each other, wherein
the respective gate insulating layer and thin-film semiconductor layer, of said thin-film transistor type photosensor and said thin-film transistor, are commonly formed as continuous layers, and wherein
the gate electrode of said thin-film transistor type photosensor and the gate electrode and the drain electrode of said thin-film transistor are electrically connected to each other.

9. An image processing apparatus according to claim 8, wherein the gate electrode of said thin-film transistor type photosensor and the gate electrode of said thin-film transistor are formed in a continuous common layer.

10. An image processing apparatus according to claim 8, wherein the thin-film semiconductor layer comprises amorphous silicon.

11. An image processing apparatus according to claim 10, wherein the thin-film semiconductor layer further includes hydrogen.

12. An image processing apparatus according to claim 8, wherein the ohmic contact layers are n-type.

13. An image processing apparatus according to claim 8, wherein the gate insulating layer includes silicon and nitrogen.

14. An image processing apparatus according to claim 13, wherein the gate insulating layer further includes hydrogen.

15. An image processing apparatus according to claim 8, further comprising a capacitor for storing charge in proportion to light incident on said thin-film transistor type photosensor, said capacitor being connected to said drain electrode of said thin-film transistor type photosensor.

16. An image processing apparatus according to claim 8, further comprising an additional thin-film transistor connected to the drain electrode of said thin-film transistor, said additional thin-film transistor arranged to apply a desired potential to said thin-film transistor.

17. An image processing apparatus according to claim 10, wherein said additional thin-film transistor comprises a source electrode and a gate electrode which are electrically connected to the drain electrode and the gate electrode of said thin-film transistor.

18. An image processing apparatus according to claim 16, further comprising a battery arranged to apply a desired voltage to a drain electrode of said additional thin-film transistor.

19. An image sensor according to claim 8, further comprising a resistance connected to the drain electrode of said thin-film transistor.

* * * * *

UNITED STATES PATENT AND TRADEMARK OFFICE
CERTIFICATE OF CORRECTION

PATENT NO. : 5,324,928
DATED : June 28, 1994
INVENTOR(S) : TOSHIHIRO SAIKA, ET AL.

It is certified that error appears in the above-identified patent and that said Letters Patent is hereby corrected as shown below:

ON TITLE PAGE

In [56] References Cited, under U.S. PATENT DOCUMENTS:
"Sakai et al." should read --Saika et al.--.

COLUMN 1

Line 15, "particularly" should read --particularly,--.
Line 19, "to" should read --and to--.
Line 50, "a shown" should read --as shown--.
Line 59, "in" should read --in that--.

COLUMN 2

Line 1, "TFTS," should read --TFTs,--.
Line 2, "TFTS." should read --TFTs.--.
Line 20, "man-hour," should read --man-hours,-- and
"any the" should read --any--.
Line 27, "a" should read --at a--.

COLUMN 3

Line 50, "a" should read --an--.

COLUMN 4

Line 13, "smoothing" should be deleted.

COLUMN 5

Line 31, "t" should read --the--.

UNITED STATES PATENT AND TRADEMARK OFFICE
CERTIFICATE OF CORRECTION

PATENT NO. : 5,324,928
DATED : June 28, 1994
INVENTOR(S) : TOSHIHIRO SAIKA, ET AL.

It is certified that error appears in the above-identified patent and that said Letters Patent is hereby corrected as shown below:

COLUMN 6

Line 27, "TFTS" should read --TFTs--.
Line 28, "TFTS." should read --TFTs.--.
Line 32, "TFTS," should read --TFTs,--.
Line 33, "TFTS." should read --TFTs.--.
Line 49, "order" should be deleted.
Line 51, "tion:" should read --tion in order:--.

COLUMN 7

Line 8, "such" should be deleted.
Line 43, "thin film" should read --thin-film--.

Signed and Sealed this

Twenty-eight Day of February, 1995

Attest:

BRUCE LEHMAN

Attesting Officer

Commissioner of Patents and Trademarks